United States Patent [19]

Overhauser et al.

[11] Patent Number: 4,857,976
[45] Date of Patent: Aug. 15, 1989

[54] HYDROGEN-STABILIZED SEMICONDUCTOR DEVICES

[75] Inventors: Albert W. Overhauser, West Lafayette, Ind.; Joseph Maserjian, LaCrescenta, Calif.

[73] Assignee: California Institute of Technology, Pasadena, Calif.

[21] Appl. No.: 284,832

[22] Filed: Dec. 13, 1988

Related U.S. Application Data

[63] Continuation of Ser. No. 68,128, Jun. 30, 1987, abandoned.

[51] Int. Cl.⁴ ............... H01L 29/78; H01L 27/02; H01L 23/36
[52] U.S. Cl. ............................... 357/23.1; 357/29; 357/51; 357/78
[58] Field of Search ............... 357/23.1, 25, 29, 51, 357/78, 85

[56] References Cited

U.S. PATENT DOCUMENTS 4,042,946 8/1977 Sokoloski .................. 357/25
4,196,438 7/1980 Carlson ..................... 357/2

OTHER PUBLICATIONS

I. Lundström et al., "A Hydrogen-Sensitive MOS Feed-Effect Transistor", *Applied Physics Letters*, vol. 26, No. 2, (Jan. 15, 1975), pp. 55–57.

*Primary Examiner*—J. Carroll
*Attorney, Agent, or Firm*—Ashen Golant Martin & Seldon

[57] ABSTRACT

Semiconductor devices, such as silicon-base MOS devices (10) and solar cells (50), degrade as a result of a variety of reasons, such as hot carriers, photons, and ionizing radiations. Degradation in such devices is cured by the presence of atomic hydrogen. Presently, such devices are exposed to atomic hydrogen during processing. However, a source of atomic hydrogen is not available to heal damage over the lifetime of the device. In accordance with the invention, a source (34, 60) of atomic hydrogen is provided in cooperative relationship with the devices. In a preferred embodiment, the source comprises a layer of palladium, disposed at an appropriate location. The palladium is charged with atomic hydrogen during packaging or encapsulating by exposure to a hydrogen-containing species. The palladium cracks the species to generate atomic hydrogen, which it stores and provides to the device on a real-time basis.

22 Claims, 1 Drawing Sheet

HYDROGEN-STABILIZED SEMICONDUCTOR DEVICES

This is a continuation of co-pending application Ser. No. 07/068,128 filed on June 30, 1987abandoned.

TECHNICAL FIELD

The present invention relates to semiconductor devices that suffer degradation caused by hot carriers, photons, and ionizing radiations, and, more particularly, to means for healing such degradation on a continuous, real-time basis.

BACKGROUND ART

A number of semiconductor devices are adversely affected by the presence of one or more of the following species: hot carriers, photons, and ionizing radiations. Such species involve breaking of existing hydrogen bonds and/or the creation of new, unsaturated silicon bonds. By ionizing radiations is meant gamma rays, such as encountered by space craft in the Van Allen belts or near Jupiter, X-rays, and ionizing ultra-violet (UV).

MOS (metal-oxide-semiconductor) devices degrade from exposure to ionizing radiation. The degradation is caused by trapping of charge in the gate oxide and by generation of interface states at the $Si/SiO_2$ interface.

VLSI (very-large-scale-integration) devices having small channel lengths (about 1 $\mu$m or less) suffer degradation from a recently identified mechanism: hot-carrier injection into the gate oxide from the channels. The hot carriers generate interface states (at the $Si/SiO_2$ interfaces) and these can degrade transistor characteristics to the point of failure. The hot carrier problem is a present limiting factor to achieving further size reduction.

The conversion efficiency of amorphous-silicon solar cells falls significantly on exposure (of the cells) to solar radiation. Electronic traps and recombination centers (in the active region of the device) are created by the radiation.

Thus, means are required for healing the degradation in semiconductor devices caused by any of hot carriers, photons, and ionizing radiations.

DISCLOSURE OF INVENTION

In accordance with the invention, semiconductor devices are provided with means for affording a substantially continuous real-time recovery of the devices from degradation caused by at least one of the following sources: hot carriers, photons, and ionizing radiations. Such means include the appropriate placement at a suitable location associated with the device of one or more materials that crack molecular hydrogen to atomic hydrogen and store the atomic hydrogen. The atomic hydrogen is then supplied on an as-needed basis to heal and repair the degradation.

The cracking and storing material may be one and the same or may comprise separate materials. Further, the cracking and storing materials may be strategically placed and hermetically sealed in the semiconductor device. The supply of hydrogen can be such as to last at least the lifetime of the device.

BEST MODES FOR CARRYING OUT THE INVENTION

Figure 1:
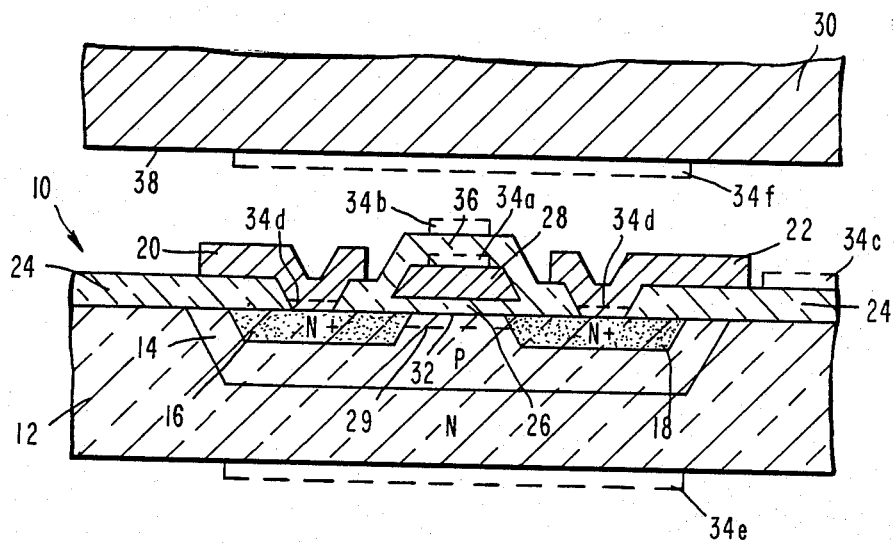
FIG. 1 is a cross-sectional view of a portion of a MOS device, depicting potential locations of the cracking and storing material, in accordance with the invention.

Referring now to the drawings wherein like numerals of reference designate like elements throughout, a conventional n-channel MOS device of a complementary MOS (CMOS) process 10 is depicted in FIG. 1. The device comprises a substrate 12, here, N-type silicon, in which is formed a P-well region 14. N+ regions 16 and 18 form the source and drain regions, respectively. Metallizations 20 and 22 provide electrical contact to the source 16 and drain 18 regions.

A field oxide 24 isolates the contact metallizations 20, 22 from the semiconductor 12. A gate oxide 26 separates a polysilicon gate 28 from n-channel region 29, and as is conventional, is comparatively thinner than the field oxide 24.

The MOS device 10 depicted in FIG. 1 is fabricated by conventional methods, which do not form a part of this invention. Typically, in this invention, just prior to final packaging, such as in an hermetic package, the device is exposed to a hydrogen-containing atmosphere, which provides a source of hydrogen for healing degradations that can be caused by hot carriers and ionizing radiation. A portion of the hermetic package is shown at 30, constituting the cover thereof.

The conventional post-metal anneal includes heating the molecular hydrogen to about 450° C. Cracking occurs at the grain boundaries, metal surfaces, etc., which generates atomic hydrogen for healing unsaturated silicon bonds. However, this conventional hydrogen-exposure process does not maintain a source of atomic hydrogen during device operation and thus degradation can occur.

In accordance with the invention, a means for affording a substantially continuous real-time recovery of the device from such degradation is provided. The means comprises a source of atomic hydrogen, which is available on an as-needed basis.

In the preferred embodiment, at least one material capable of cracking and/or storing hydrogen is provided in association with the device. An example of a suitable cracking and storing material is palladium, which cracks molecular hydrogen to atomic hydrogen and stores it. Another example of such a material is platinum. To the extent that other materials may perform at least one of these functions, such other materials are also useful in the practice of the invention. For example, alloys of palladium-platinum and palladium-silver, among others, may be suitably employed.

The source of the atomic hydrogen need not be molecular hydrogen, but may comprise ammonia, for example. The above-mentioned materials are also suitable for cracking ammonia and/or storing the resulting atomic hydrogen. Alternatively, another safe source of atomic hydrogen may comprise the use of forming gas (nitrogen or argon plus about 20% molecular hydrogen) or other similar hydrogen-containing gas. Thus, the source of atomic hydrogen may comprise any hydrogen-containing species capable of being cracked to form the requisite atomic hydrogen.

The material used to crack molecular hydrogen or ammonia and/or store atomic hydrogen, referred to hereinafter as the stabilizing material, may be placed in several locations on the device. Since the degradation occurs at the active interface 32 beneath the gate oxide 26, placement as close thereto as possible is desired. Appropriate locations include (a) on top of the gate metal 28 at 34a, (b) on top of the gate-encapsulating oxide 36 at 34b, (c) on top of the field oxide 24 as close to the active region as possible at 34c, (d) between the source and/or drain contacts 20, 22, respectively, and the underlying silicon 12 at 34d, or (e) on the backside of the substrate at 34e. Each of the locations may be preferred in various circumstances.

The atomic hydrogen moves to the active interface 32 by diffusion, and in most materials such as silicon and oxides, the diffusion therethrough is rapid, being blocked only by certain materials, such as nitrides and some silicides. Diffusion of atomic hydrogen can also be limited by interfaces and grain boundaries, which at room temperature can cause the atomic hydrogen to recombine and form molecular hydrogen. Note that the reverse process of cracking occurs only at higher temperatures such as 450° C. in post-metal anneals.

Accordingly, locations such as 34a-c may not be as desirable as 34d-e. Also, while 34e is further away, and diffusion through the substrate could adversely affect doping levels, the rapid extent of the diffusion may negate the distance consideration. Further, formation on the backside 34e can be done when the device is completed, thereby not requiring an additional step during present processing, needed by the other locations.

The stabilizing material is conveniently formed as a layer at the indicated locations. If the stabilizing material comprises palladium, it is known that up to about 60 at. % H can be stored in Pd at room temperature. For layers of the dimensions given below, this is an ample supply of atomic hydrogen over the lifetime of the device.

At higher levels of storage, blistering occurs. Accordingly, the amount of hydrogen stored should probably be limited to less than 60 at. %. Simple experimentation may be used to determine the appropriate amount.

If the palladium is at the source and/or drain contacts 20, 22, for instance, the thickness of the layer could be about 100 nm. At this value, the palladium 34d serves as the cracking catalyst, with storage being done by the same or, perhaps, other material at another location.

If the palladium is formed on an oxide surface, such as at 34b or 34c, then less than about 100 nm should be used, to avoid swelling and/or peeling of the layer. On the other hand, if formed on the backside at 34e, up to about 1 μm thick layers may be utilized on an adhering surface.

As an indication of the suitability of the invention, 1 μm of palladium having an area of 1 cm$^2$ would store more than $10^5$ times the atomic hydrogen needed to heal and repair the degradation over the lifetime of the device.

Formation of any of the palladium layers 34 may be done by any of the conventional deposition techniques, such as evaporation, sputtering, and chemical-vapor-deposition. If additional storage is required, a thick palladium layer 34f could be plated on the interior surface 38 of the device package 30. Of course, the same deposition techniques may be employed with any of the stabilizing materials.

Hydrogen-loading the stabilizing material, e.g., palladium, is simply done by exposing the material to a hydrogen-containing atmosphere, such as molecular hydrogen, forming gas, or ammonia, prior to hermetic sealing of the package. Where an hermetic sealed package is not used, but rather an encapsulating layer of silicon nitride is employed, the layer of stabilizing material may be formed at the appropriate locations and exposed to the hydrogen-containing environment prior to the encapsulation.

Figure 2:
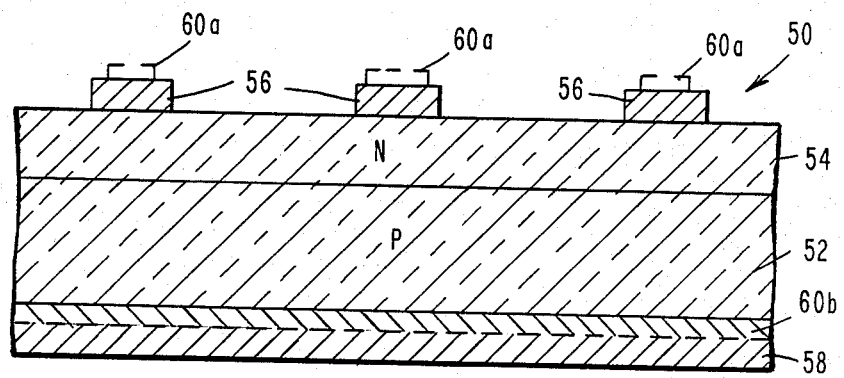
FIG. 2 is a cross-sectional view of a portion of an amorphous-silicon solar cell, depicting potential locations of the cracking and storing material, in accordance with the invention.

FIG. 2 depicts a cross-section of an amorphous-silicon (a-silicon) solar cell 50, which comprises a layer 52 of a-silicon of one conductivity type, here, P-type, overlaid with a layer 54 of α-silicon of the opposite conductivity type, here, N-type. These layers 52, 54 are deposited on a suitable metallized substrate 58. Grid contacts 56 are formed on the front surface of the device.

The stabilizing material may be placed at locations denoted 60a (on the surface of the grid contacts 56) and/or 60b (on the surface of the metallized substrate 58). Hydrogen is loaded into the stabilizing material 34 (e.g., Pd) during the subsequent deposition of a-silicon, for example by the decomposition of silane ($SiH_4$=->$Si+4H$). The considerations discussed above obtain here as well, except that the failure mechanisms are the breaking of HSi bonds by photons and ionizing radiations, not by hot carriers. The source of atomic hydrogen heals degradation which occurs in the active regions of the device.

The foregoing description has been primarily directed to healing of degradation in silicon-based MOS and solar cell devices. However, it will be appreciated by those skilled in the art that the particular embodiments described are not limited to the specific conductivity type materials shown, and that P-type material may be employed in place of N-type material and visa versa.

Further, it will be appreciated that the teachings of the invention may be used to provide a source of atomic hydrogen in a variety of semiconductor devices. For example, the role of hydrogen in healing degradation in III-V devices, such as GaAs-based devices, is presently speculative. To the extent that a source of atomic hydrogen would be beneficial in repairing such devices, the invention contemplates use therein. Examples of other devices which may benefit from the teachings of the invention include optoelectronic devices, CCDs (charge-coupled devices), MIS (metal-insulator-semiconductor) devices, amorphous-silicon switching devices, and indeed any device having a dielectric interface with a semiconductor or heterojunctions (interface between two different semiconductor materials), and active regions therein.

INDUSTRIAL APPLICABILITY

The teachings of the invention may be suitably employed with semiconductor devices of all types exposed to degradation-causing sources, such as hot carriers, photons, and ionizing radiations to provide a continuing supply of atomic hydrogen to heal degradation caused by such sources.

Thus, there has been disclosed means for providing a real-time supply of atomic hydrogen available for healing degradation in semiconductor devices caused by a variety of sources, such as hot carriers, photons, and ionizing radiations. It will be apparent to those of ordinary skill in the art that many changes and modifications of an obvious nature may be made without departing from the spirit and scope of the invention, and all such changes and modifications are considered to fall within the scope of the appended claims.

What is claimed:

1. A semiconductor device having passive means for providing a substantially continuous real-time recovery of said device from degradation caused by at least one of the following sources: hot carriers, photons, and ionizing radiation, said passive means comprising a source of a hydrogen-containing species and a material capable of cracking said hydrogen-containing species to generate atomic hydrogen as needed, which provides said recovery of said device.

2. The device of claim 1 wherein said device is based on silicon technology.

3. The device of claim 1 wherein said means further includes a material capable of storing atomic hydrogen.

4. The device of claim 3 wherein said material comprises a material selected from the group consisting of palladium, platinum and alloys thereof.

5. The device of claim 4 wherein said material comprises palladium.

6. The device of claim 1 wherein said hydrogen-containing species comprises a member selected from the group consisting of molecular hydrogen, ammonia, and forming gas.

7. A silicon device having passive means for supplying a substantially continuous source of atomic hydrogen to enable real-time recovery of said devices from degradation caused by at least one of the following sources: hot carriers, photons, and ionizing radiations, said passive means comprising a source of hydrogen-containing species and a material capable of cracking said hydrogen-containing species to generate said atomic hydrogen.

8. The device of claim 7 wherein said means further includes a material capable of storing atomic hydrogen.

9. The device of claim 8 wherein said material comprises a material selected from the group consisting of palladium, platinum and alloys thereof.

10. The device of claim 9 wherein said material comprises palladium.

11. The device of claim 7 wherein said hydrogen-containing species comprises a member selected from the group consisting of molecular hydrogen, ammonia, and forming gas.

12. A silicon device including a passive layer of hydrogen-loaded palladium operatively associated therewith for providing a substantially continuous real-time recovery of said devices from degradation caused by at least one of the following sources: hot carriers, photons, and ionizing radiations, said hydrogen-loaded palladium providing a source of atomic hydrogen which provides said recovery of said devices.

13. A MOS device having source and drain regions separated by an active region associated with a gate contact, said device provided with passive means for supplying a substantially continuous source of atomic hydrogen to enable real-time recovery of said devics from degradation in said active region caused by at least one of the following sources: hot carriers, photons, and ionizing radiations, said passive means comprising a hydrogen-containing species and a material capable of cracking said hydrogen-containing species to generate said atomic hydrogen.

14. The device of claim 13 wherein said means further includes a material capable of storing atomic hydrogen.

15. The device of claim 14 wherein said material comprises a material selected from the group consisting of palladium, platinum and alloys thereof.

16. The device of claim 15 wherein said material comprises palladium.

17. The device of claim 13 wherein said hydrogen-containing species comprises a member selected from the group consisting of molecular hydrogen, ammonia, and forming gas.

18. An amorphous solar cell having a P-N junction formed by a P-type region and an N-type region, with contacts to each said region, said cell provided with passive means for supplying a substantially continuous source of atomic hydrogen to enable real-time recovery of said devices from degradation in bulk regions caused by at least one of the following sources: hot carriers, photons, and ionizing radiations, said passive means comprising a hydrogen-containing species and a material capable of cracking said hydrogen-containing species to generate said atomic hydrogen.

19. The device of claim 18 wherein said means further includes a material capable of storing atomic hydrogen.

20. The device of claim 19 wherein said material comprises a material selected from the group consisting of palladium, platinum and alloys thereof.

21. The device of claim 20 wherein said material comprises palladium.

22. The device of claim 18 wherein said hydrogen-containing species comprises a member selected from the group consisting of molecular hydrogen, ammonia, and forming gas.

* * * * *